(12) United States Patent
Yamazaki

(10) Patent No.: US 7,539,369 B2
(45) Date of Patent: May 26, 2009

(54) OPTICAL DEVICE AND MANUFACTURING METHOD THEREOF

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/054,613

(22) Filed: Mar. 25, 2008

(65) Prior Publication Data

US 2008/0240646 A1    Oct. 2, 2008

(30) Foreign Application Priority Data

Mar. 29, 2007    (JP)    ............... 2007-088642

(51) Int. Cl.
*G02B 6/12*    (2006.01)

(52) U.S. Cl. ............... 385/14; 385/27; 385/30; 385/32; 385/39; 333/219; 398/59; 398/187

(58) Field of Classification Search ............... 385/14, 385/27, 30, 32, 39; 333/219; 398/59, 187
See application file for complete search history.

(56) References Cited

U.S. PATENT DOCUMENTS

| 5,420,541 | A | * | 5/1995 | Upton et al. ............... 330/286 |
| 5,859,942 | A | | 1/1999 | Ueda | |
| 2004/0161188 | A1 | * | 8/2004 | Su et al. ............... 385/24 |
| 2006/0198416 | A1 | * | 9/2006 | Yamazaki ............... 372/94 |
| 2006/0222039 | A1 | * | 10/2006 | Yamazaki ............... 372/94 |
| 2006/0228120 | A9 | * | 10/2006 | McCallion et al. ......... 398/187 |
| 2008/0232409 | A1 | * | 9/2008 | Yamazaki ............... 372/20 |
| 2008/0259437 | A1 | * | 10/2008 | Suzuki ............... 359/326 |

FOREIGN PATENT DOCUMENTS

| EP | 1708323 A2 | 10/2006 |
| JP | 09080497 A | 3/1997 |
| JP | 11026875 A | 1/1999 |
| JP | 2000231041 A | 8/2000 |
| JP | 2006278769 A | 10/2006 |
| WO | WO 2004034528 A2 * | 4/2004 |
| WO | 2006028531 A2 | 3/2006 |

OTHER PUBLICATIONS

Takahashi et al, "A stable widely tunable laser using a silica-waveguide triple-ring resonator", 2005 Optical Society of America.*
Partial European Search Report for EP Application No. 08101976.2, search completed Jul. 23, 2008.

* cited by examiner

*Primary Examiner*—Ellen E. Kim

(57) ABSTRACT

An optical device includes: a substrate side waveguide formed on a substrate; and a plurality of optical elements fixed on the substrate. The substrate side waveguide and an optical element side waveguide formed in each of the plurality of optical elements forms a continuous optical waveguide path.

8 Claims, 9 Drawing Sheets

(a) ELECTRODE PATTERN ON CONTACT SURFACE (b) ELECTRODE PATTERN ON BACK OF ELEMENT

US 7,539,369 B2

OPTICAL DEVICE AND MANUFACTURING METHOD THEREOF

This application is based on Japanese Patent Application No. 2007-088642 filed on Mar. 29, 2007. The disclosure of the Japanese Patent Application is incorporated herein by reference.

TECHNICAL FIELD

The present invention relates to an optical device.

BACKGROUND ART

Facing a broadband era, a WDM (Wavelength Division Multiplexing) transmission system able to communicate in a plurality of optical wavelengths is introduced progressively in order to utilize an optical fiber efficiently. In recent years, utilization of a DWDM device (the Dense Wavelength Division Multiplexer) able to multiplex dozens of optical wavelengths and perform transmission with further high speed also expands widely. Each WDM transmission system requires light sources corresponding to each optical wavelength and the required number thereof is rapidly increasing with higher multiplexing. Further in these days, a study for commercializing a ROADM (Reconfigurable Optical Add/Drop Multiplexers) which adds/drops arbitrary wavelength in each node advances. With introducing the system, optical path switching based on wavelength changing can be realized in addition to the enhancement of transmission capacity based on wavelength multiplexing and the flexibility of an optical network exceedingly expands.

As a light source for the WDM transmission system, a distributed feedback type semiconductor laser (a DFB-LD; Distributed FeedBack Laser Diode) oscillating in a single axial mode has been widely used until now because of the usability and high reliability thereof. In the DFB-LD, a diffraction grating having a depth of approximately 30 nm is formed in the entire area of a resonator and realizes stable oscillation in a single axial mode at a wavelength corresponding to a product of the diffraction grating period and double of the equivalent refractive index. Since the DFB-LD cannot be tuned over broad range of oscillation wavelength regardless of the stable oscillation in the single axial mode, the WDM transmission system is configured by generally using products different only in the wavelength in every ITU grid. For this reason, it is required to use different products for every wavelength, and that results in increasing of cost for stock control and keeping surplus of stock for dealing with a failure. Furthermore, in the ROADM that changes an optical path by changing a wavelength, since a variable width thereof is limited to a range of wavelength changing depending on the temperature, that is, approximately 3 nm when a normal DFB-LD is used, it becomes difficult to configure an optical network which utilizes features of the ROADM positively using resource of wavelength.

To overcome the problems of the present DFB-LD and realize the single axial mode oscillation over broad range of wavelength, the wavelength-tunable laser is energetically studied. The wavelength-tunable laser is classified broadly into two types. In one type, a wavelength-tunable mechanism is formed into a same element with a laser resonator. In the other type, the wavelength-tunable mechanism is formed outside the element. As the former, many structures are proposed, such as a DBR-LD (Distributed Bragg Reflector Laser Diode) where an emission area and a distributed reflection area are arranged with being separated in a same element, which is shown in FIG. 1, a Sampled-grating-DBR-LD which periodically changes diffraction grating period further and sandwiching an emission area therebetween, which is shown in FIG. 2, and an SSG (Super Structure Grating)-DBR-LD similar to this, which is shown in FIG. 3. At first, the tuning range of the wavelength of the DBR-LD was limited to approximately 10 nm at most. However, the later proposed Sampled-grating-DBR-LD realizes a wavelength-tunable operation over 100 nm and a quasi-continuous wavelength-tunable operation in 40 nm by skillfully utilizing the vernier effect being specific to the structure.

As the latter wavelength-tunable light source in which the wavelength-tunable mechanism is arranged outside the device, a method for arranging a diffraction grating outside the element as shown in FIG. 4, precisely adjusting an angle and a distance thereof, and performing a wavelength-tunable operation is proposed.

A structure for realizing a wavelength-tunable light source by configuring an optical resonator with using a PLC (Planar Lightwave Circuit) and by directly mounting an LD or an SOA (Semiconductor Optical Amplifier) on the PLC is also proposed. FIG. 5 shows a structure realizing a wavelength-tunable light source by combining a ring resonator and an SOA. The ring resonator composed of the PLC is characterized in that the lengths of the circumferences are slightly different to each other. The differences of the length of the circumferences generate the vernier effect to realize the wavelength-tunable operation in broad wavelength range.

In addition to these wavelength-tunable laser elements, research and development for a configuration in which a modulator is added in the same module are presently advanced. FIG. 6 shows an example of this. A Mach-Zehnder modulator is integrated monolithically on an output side of the above mentioned Sampled-grating-DBR-LD to generate high-speed and low-chirping modulation signals enabling long distance and large capacity optical communication. By using this integrated element, both of a wavelength-tuning and a modulation can be implemented by using a very compact module. Herewith, substantial miniaturization of a wavelength-tunable transponder module can be realized.

Some examples of documents describing related techniques will be shown below. Japanese Laid-Open Patent Application JP-P2006-278769A describes a wavelength-tunable laser which includes a multiple-ring resonator composed of ring waveguides having optical lengths to each other.

Japanese Laid-Open Patent Application JP-A-Heisei, 09-80497 describes a laser beam generator which realizes the increase of wavelength conversion light power by enabling the enhancement of the combining efficiency of a semiconductor laser with an optical waveguide through changing a polarized wave direction of an oscillating mode of the semiconductor laser as a main wave light source.

Japanese Laid-Open Patent Application JP-A-Heisei, 11-26875 describes an optical combined module introduced by mounting all emitting/receiving elements and optical elements on a substrate and by using a passive alignment method for securing the optical elements.

Japanese Laid-Open Patent Application JP-P2000-231041A describes an alignment technique and will be referred later.

SUMMARY

There are two kinds of method which can be considered for integrating a modulator with a wavelength-tunable laser: a method where they are separately manufactured, respectively, and optically connected in a module; a method for monolithically integrating as shown in FIG. 6. Since the former requires complicated module manufacturing processes, it is difficult to boost the yield. On the contrary, in the latter method, since a semiconductor element itself is small-sized, it has an advantage to be able to be mounted into a compact module. On the other hand, at least five crystalline growths and associated complicated semiconductor processes are required. There is concern that characteristic yield caused by this complicated manufacturing process tends to be lowered and that the number of steps for sorting elements and manufacturing costs tend to increase.

Further, since refractive-index adjusting by carrier injection is used in the monolithically integrated wavelength-tunable laser, loss caused by this deteriorates oscillation characteristics. For this reason, in the Sampled-grating-DBR-LD shown in FIG. 2, for example, a structure of monolithically integrating the SOA on a side of optical output end surface is employed and a structure for assuring lowering of optical outputs occurring in wavelength-tuning is introduced. Since the integration of the SOA further complicates an element structure, it becomes more difficult to achieve a high yield.

In addition, in a compound semiconductor element, especially InP series semiconductor, the wafer size thereof cannot be expected to be larger than 2 inches. For this reason, the increase of element area in the case of the monolithic integration is directly reflected to an increase of the cost thereof.

The present invention seeks to solve one or more of the above mentioned problems when the functionally integrated wavelength-tunable laser is realized, to mount various types of optical active element in low costs and high yields, and to provide an integrated optical element required in an optical network smoothly.

In an exemplary aspect of the present invention, an optical device includes: a substrate side waveguide formed on a substrate; and a plurality of optical elements fixed on the substrate. The substrate side waveguide and an optical element side waveguide formed in each of the plurality of optical elements forms a continuous optical waveguide path.

In another exemplary aspect of the present invention, a manufacturing method of an optical device includes: forming a planar optical waveguide on a substrate; forming a first substrate side alignment mark represented by a distinction between an area which transmits an alignment light of a predetermined wavelength and an area being opaque to the alignment light; forming a first optical element having a first optical element side alignment mark represented by a distinction between an area which transmits the alignment light and an area being opaque to the alignment light; putting the first optical element on the substrate; aligning a position of the first optical element on the substrate to couple the planar optical waveguide and an optical waveguide formed in the first optical element by detecting the first substrate side alignment mark and the first optical element side alignment mark with irradiating the alignment light; and fixing the first optical element on the substrate.

In further another exemplary aspect of the present invention, a manufacturing method of an optical device includes: forming a planar optical waveguide on a substrate; forming a first substrate side alignment mark represented by a distinction between an area which transmits an alignment light of a predetermined wavelength and an area being opaque to the alignment light; forming a first optical element having a first optical element side alignment mark represented by a distinction between an area which transmits the alignment light and an area being opaque to the alignment light; putting the first optical element on the substrate; aligning a position of the first optical element on the substrate to couple the planar optical waveguide and an optical waveguide formed in the first optical element by detecting the first substrate side alignment mark and the first optical element side alignment mark with irradiating the alignment light; and fixing the first optical element on the substrate.

Preferably, in an exemplary embodiment of the manufacturing method of the optical device according to the present invention, the first optical element is fixed to the substrate with a first soldering material. And the manufacturing method further includes: forming a second substrate side alignment mark represented by a distinction between an area which transmits the alignment light and an area being opaque to the alignment light; forming a second optical element having a second optical element side alignment mark represented by a distinction between an area which transmits the alignment light and an area being opaque to the alignment light; putting the second optical element on the substrate; aligning a position of the second optical element on the substrate to couple the planar optical waveguide and an optical waveguide formed in the second optical element by detecting the second substrate side alignment mark and the second optical element side alignment mark with irradiating the alignment light; and fixing the second optical element to the substrate by using a soldering material whose melting point is lower than the first soldering material after the first optical element is fixed to the substrate.

Preferably, in an exemplary embodiment of the manufacturing method of the optical device according to the present invention, the first optical element is fixed to the substrate by pressure bonding. And the manufacturing method further includes: forming a second substrate side alignment mark represented by a distinction between an area which transmits the alignment light and an area being opaque to the alignment light; forming a second optical element having a second optical element side alignment mark represented by a distinction between an area which transmits the alignment light and an area being opaque to the alignment light; putting the second optical element on the substrate; aligning a position of the second optical element on the substrate to couple the planar optical waveguide and an optical waveguide formed in the second optical element by detecting the second substrate side alignment mark and the second optical element side alignment mark with irradiating the alignment light; and fixing the second optical element to the substrate by pressure bonding of a metal after fixing the first optical element to the substrate.

As described above, required optical function can be easily realized through mounting required active elements such as the SOA and the modulator as multi-chip structure by a passive alignment on a Si substrate. Combination of optical devices having such different functions has usually been realized via optical lends and so on, however, the structure is considerably simplified by employing the passive alignment technique for multi-chip proposed. As a result, improvement of reliability, cost reduction, and shortening of module lead time can be expected.

In the above description, an integration method for the booster SOA and the modulator was described with regard to the wavelength-tunable laser. However, another integrated function can be newly added through integrating an optical active element of other optical function, for example, wavelength-tuning and so on.

BRIEF DESCRIPTION OF THE DRAWINGS

The above and other objects, advantages and features of the present invention will be more apparent from the following description of certain exemplary embodiments taken in conjunction with the accompanying drawings, in which.

EXEMPLARY EMBODIMENTS

Hereinafter, an optical device and manufacturing method thereof according to exemplary embodiments of the present invention will be described with reference to the attached drawings.

Figure 1:
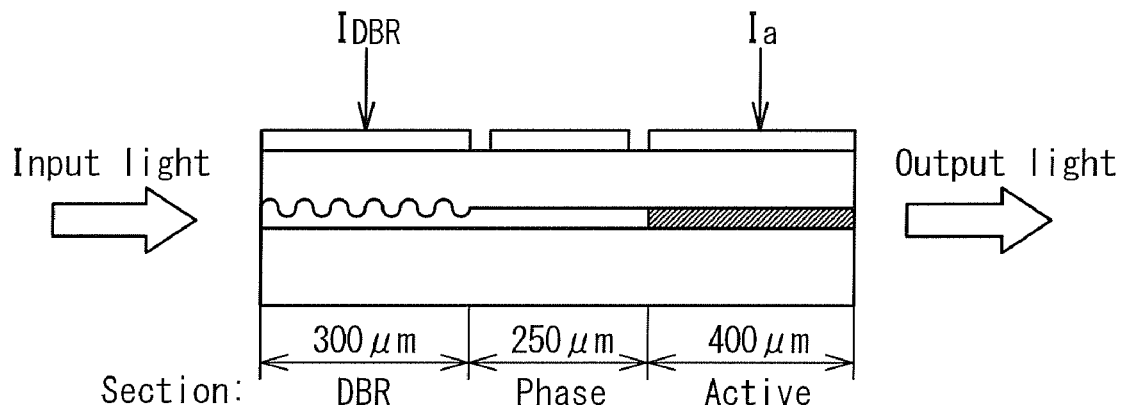
FIG. 1 shows an example of a wavelength-tunable laser in a related technique.
Figure 2:
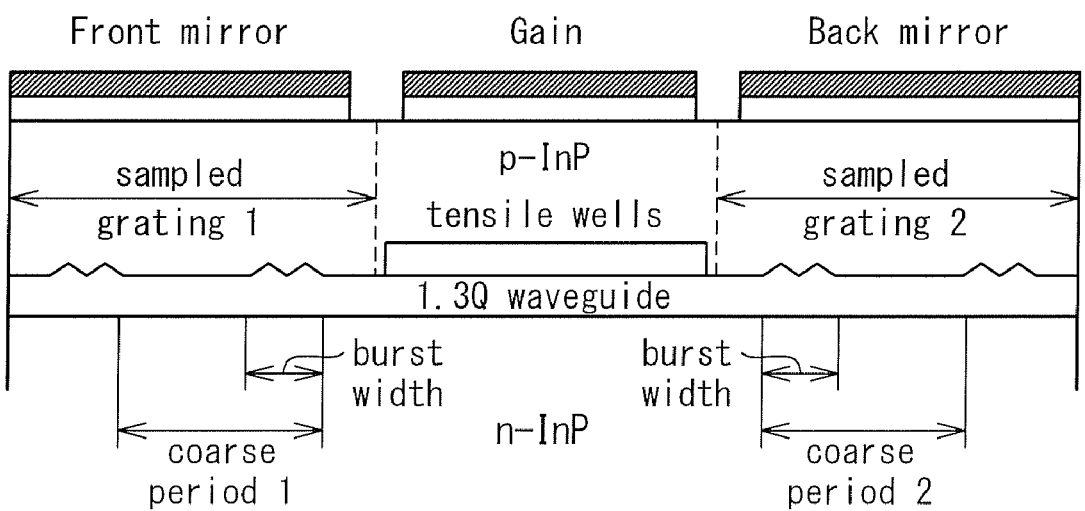
FIG. 2 shows an example of the wavelength-tunable laser in a related technique.
Figure 3:
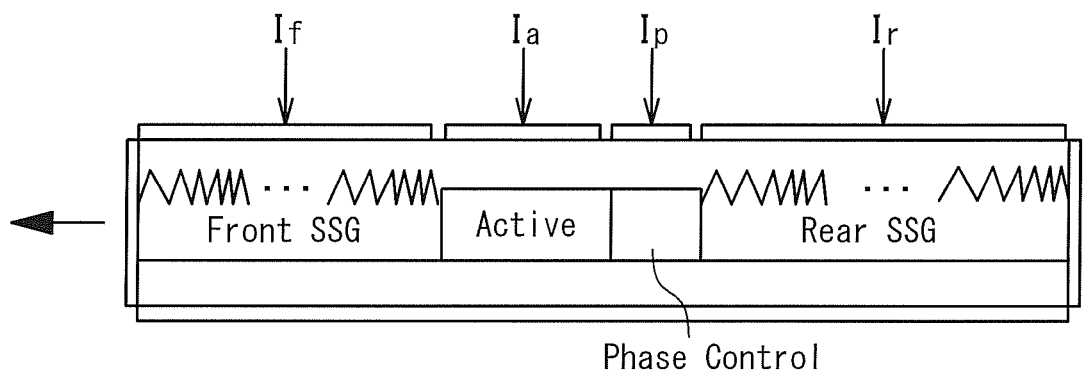
FIG. 3 shows an example of the wavelength-tunable laser in a related technique.
Figure 4:
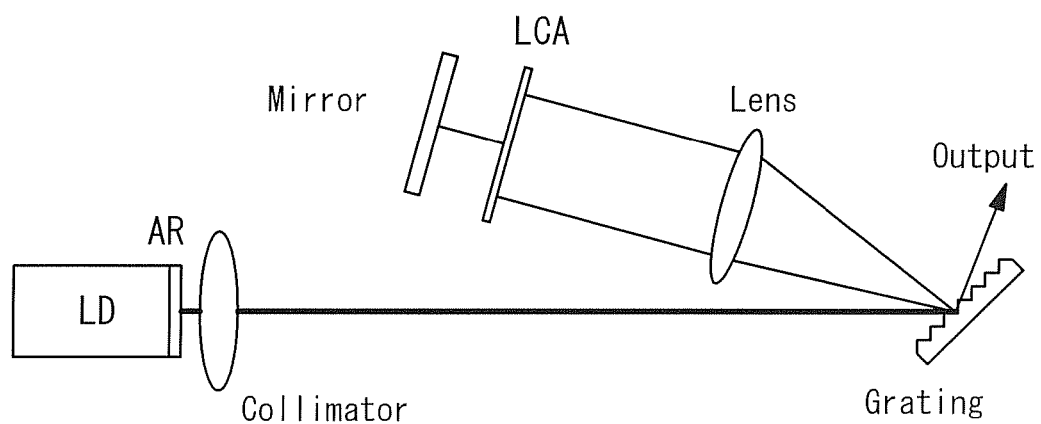
FIG. 4 shows an example of the wavelength-tunable laser in a related technique.
Figure 5:
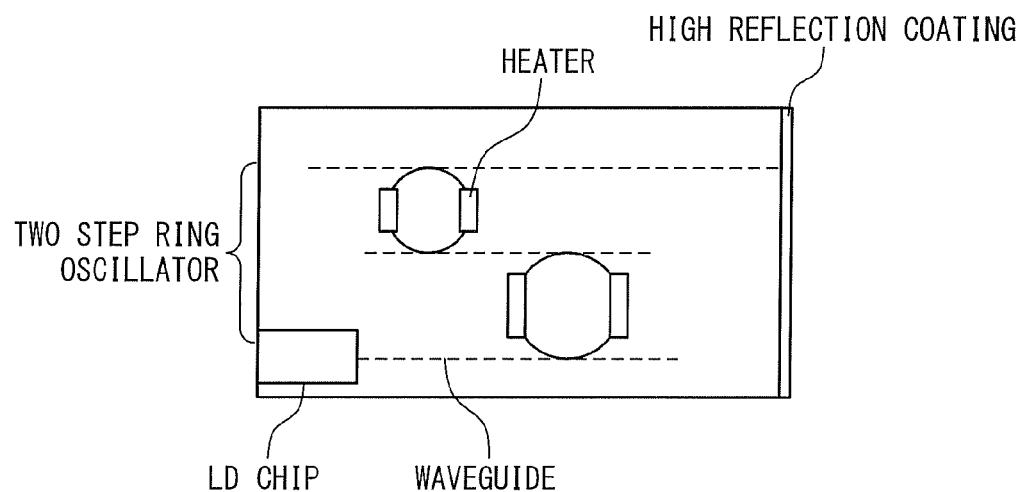
FIG. 5 shows an example of the wavelength-tunable laser in a related technique.
Figure 6:
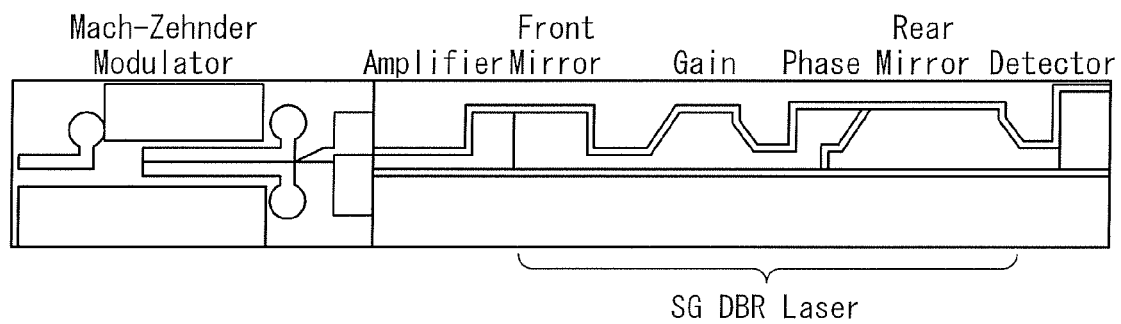
FIG. 6 shows an example of the wavelength-tunable laser in a related technique.
Figure 7:
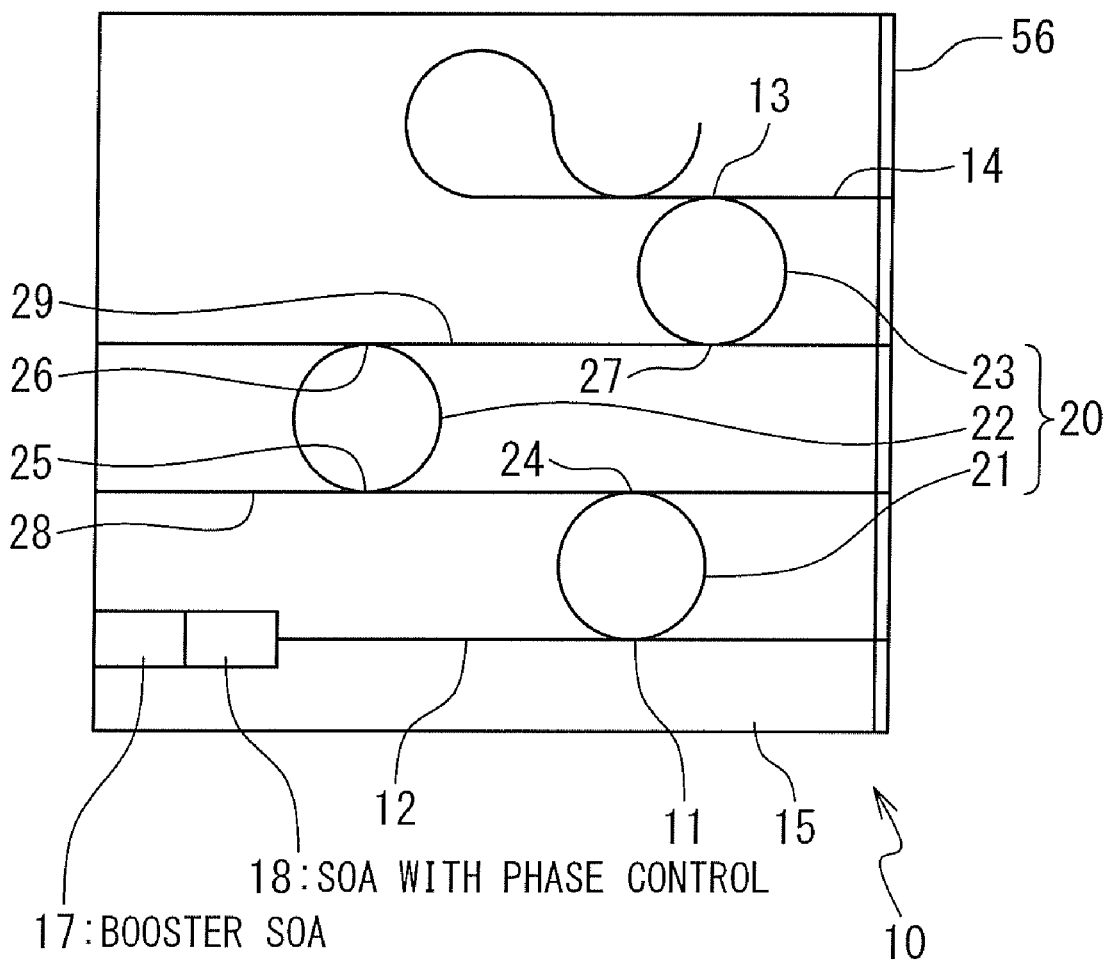
FIG. 7 shows a wavelength-tunable laser according to an exemplary embodiment of the present invention.

FIG. 7 shows a configuration of a wavelength-tunable laser 10 on which a booster SOA is integrated. The wavelength-tunable laser 10 includes three ring resonators 21 to 23 which are ring waveguides whose optical path lengths are different to each other, a multiple ring resonator 20 which is formed by connecting the ring resonators 21 to 23 via directional couplers 24 to 27 and waveguides 28 and 29, an input-output side waveguide 12 connected at one end thereof to the ring resonator 21 via a directional coupler 11, a reverse side waveguide 14 connected at one end thereof to the ring resonator 23 via a directional coupler 13, a PLC substrate 15 on which the multiple ring resonator 20, the input-output side waveguide 12, and the reverse side waveguide 14 are formed, a high reflection film 56 provided at the other end of the reverse side waveguide 14, an SOA with phase control 18 (phase controlling semiconductor amplifier) in which one optical input-output end is connected to the other end of the input-output side waveguide 12, and a booster SOA 17 whose optical input-output end is connected to the other optical input-output end of the SOA with phase control 18. The wavelength-tunable laser 10 further includes a film heater for changing a resonance wavelength of the multiple ring resonator 20 by heating the ring resonators 21 to 23 to functions as an oscillation wavelength tuning section of the wavelength-tunable laser 10, a mode filter for transmitting light in a basic mode with suppressing entering of light in a higher order mode with respect to the multiple ring resonator 20, and so on.

The ring resonators 21 to 23 are formed with using a PLC technique for example, and the respective waveguides such as the ring waveguides are, for example, formed of silica based glass waveguides which are made by depositing silica based glass on a silicon substrate and a glass substrate, of ferroelectric waveguides which are made of thin film formed ferroelectric material (lithium niobate and the like), and so on.

Light emitted from the booster SOA 17 returns through a path in the order of the booster SOA 17, the SOA with phase control 18, the input-output side waveguide 12, the directional coupler 11, the multiple ring resonator 20, the directional coupler 13, the reverse side waveguide 14, the high reflection film 56, the reverse side waveguide 14, the directional coupler 13, the multiple ring resonator 20 and mode filters 32 and 33, the directional coupler 11, the input-output side waveguide 12 and mode filter 31, and the SOA 17. When the wavelength of the returned light is same to the resonance wavelength of the multiple ring resonator 20, the returned light becomes most strong. The reason comes from that, since the respective ring resonators 21 to 23 composing the multiple ring resonator 20 have FSRs (Free Spectral Range) slightly different to each other, further strong reflection occurs at a wavelength (resonance wavelength) at which periodical fluctuations of reflections (transmissions) occurring in respective ring resonators 21 to 23 agree with each other.

On the other hand, a resonance wavelength, that is, a wavelength at which periods agree with each other changes significantly depending on circumference lengths of the respective ring resonators 21 to 23 and change of a waveguide reflective index. This waveguide reflective index can be adjusted based on the thermo-optical effect. That is to say, a resonance wavelength of the multiple ring resonator 20 can be changed by controlling an amount of electricity in the film heaters provided on respective positions corresponding to the ring resonators 22 and 23 with utilizing temperature characteristics of the ring resonators 22 and 23. A wavelength of the light emitted from the booster SOA 17 is also controlled to be changed in the SOA with phase control 18. As described above, in a present embodiment, the multiple ring resonator 20 is configured by coupling, in series, three ring resonators 21 to 23 whose circumference lengths are slightly different to each other, and the vernier effect occurred by this configuration is sophisticatedly utilized.

On the PLC substrate 15, the SOA with phase control 18 with nonreflecting coating is directly mounted at an end on a side connecting to the input-output side waveguide 12. The SOA with phase control 18 is directly mounted on the PLC substrate 15 by using a passive alignment technique. The passive alignment technique, which will be described later, implements positioning with using a mark pattern formed on the PLC substrate surface and a mark pattern on an LD chip. By employing the passive alignment technique, an optical axis adjustment which is usually implemented in a manufacturing process of an optical module becomes not necessary and the manufacturing cost and lead time can be significantly suppressed.

Further, the booster SOA 17 is configured as an element other than the SOA with phase control 18. And the booster SOA 17 and the SOA with phase control 18 are mounted on a same PLC substrate 15 with using the passive alignment technique. Through the mounting in such method, a waveguide of the booster SOA 17 and a waveguide of the SOA with phase control 18 are connected with high efficiency. Since the non-defectiveness of the SOA with phase control 18 and booster SOA 17 are sorted in an individual chip level, lowering of yields caused by a defect of only one of the SOA elements can be avoided. As mentioned above, required characteristics can be realized by mounting optical elements corresponding to required functions in multi-chip configuration. By further integrating the booster SOA, a high output operation can be realized.

Figure 8:
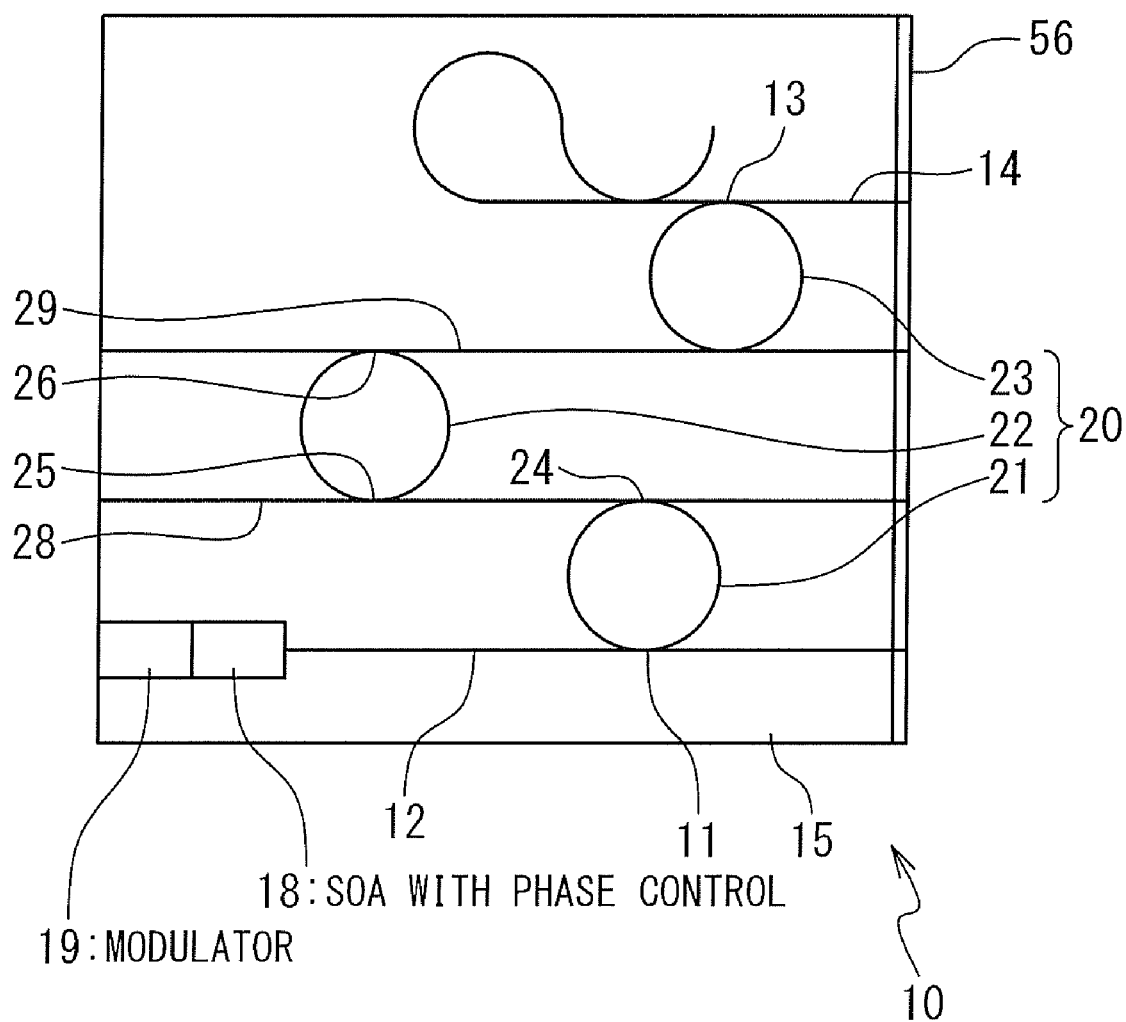
FIG. 8 shows the wavelength-tunable laser according to an exemplary embodiment of the present invention.

FIG. 8 shows a modulator integrated wavelength-tunable laser according to an exemplary example of the present invention. On the PLC substrate 15, the SOA with phase control 18 with nonreflecting coating is directly mounted at an end on a side connecting to the input-output side waveguide 12, similar to FIG. 7. The multiple ring resonator 20 with three stages configuration is formed on the connected input-output side waveguide 12, and herewith the wavelength is adjusted. The SOA with phase control 18 is directly mounted on the PLC substrate 15 based on the passive alignment technique. Further, on an output side of the SOA with phase control 18, the modulator 19 is mounted as a chip different to the SOA with phase control 18 on the PLC substrate 15 based on the passive alignment technique to realize the modulation. The wavelength-tuning is conducted by supplying electricity to the heaters formed on each of the ring resonators 21 to 23 to change the reflective indexes thereof. Similar to FIG. 7, in this configuration, the non-defectiveness of the SOA with phase control 18 and modulator 19 can be sorted preliminarily and individually, so that the lowering of yield caused by a defect of only one of the SOA with phase control 18 and modulator 19 can be avoided.

In the above explanation, a method for integrating the booster SOA 17 and the modulator 19 with respect to the wavelength-tunable laser was exemplified. However, another integrated function can be realized by integrating elements having other optical functions, for example, photoactive elements for wavelength-tuning and so on.

Next, a method for mounting semiconductor elements such as the SOA and the modulator on the substrate based on the passive alignment will be explained in detail. A technique for positioning a single semiconductor element based on the passive alignment is described in the aforementioned document JP-P2000-231041A for example.

Figure 9A:
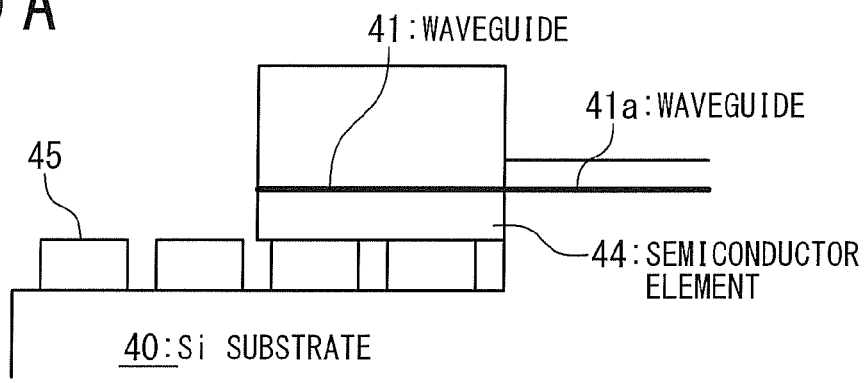
FIG. 9A is a view for explaining a method of a passive alignment.
Figure 9B:
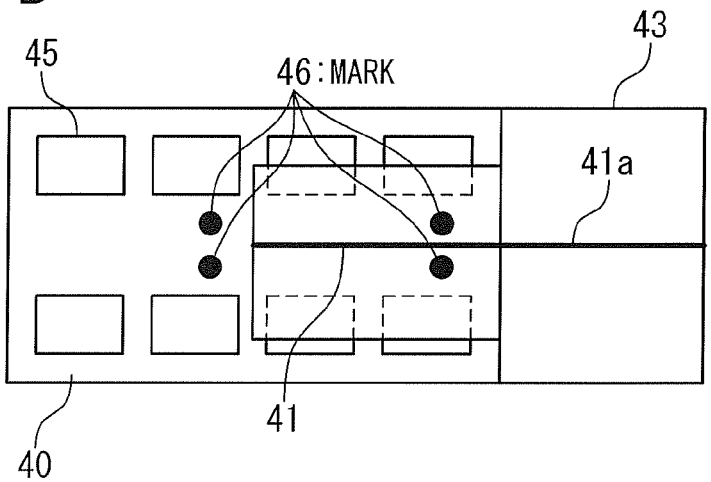
FIG. 9B is a view for explaining a method of a passive alignment.
Figure 9C:
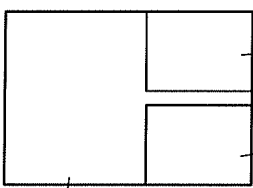
FIG. 9C is a view for explaining a method of a passive alignment.

Referring to FIGS. 9A to 9C, a procedure for mounting one semiconductor element on a substrate will be explained. FIG. 9A is a sectional view of an Si substrate 40 and a semiconductor element 44, and FIG. 9B is an upper view thereof. As the PLC substrate 15 shown in FIGS. 7 and 8, the Si substrate 40 is provided. By forming a substrate side waveguide 41a on the Si substrate 40, a PLC (Planar Lightwave Circuit) is formed. The waveguide 41a shown in FIGS. 9A and 9B corresponds to an area around the SOA with phase control 18 of the input-output side waveguide 12 shown in FIGS. 7 and 8.

The waveguide 41a near the semiconductor element 44 is formed in a position of predetermined first depth from the upper surface of the Si substrate 40. In an arrangement area for arranging the semiconductor element 44, the Si substrate 40 is trimmed to a second depth deeper than the first depth. The surface in the trimmed arrangement area is substantially parallel with the upper surface in an area which is not trimmed. One end of the waveguide 41a is exposed in a side surface of the arrangement area. A waveguide 41 (also referred to as an optical device element side waveguide) formed in the semiconductor element 44 is coupled to the one end of the waveguide 41a so as to form a continuous optical waveguide path.

A platform member 45 for adjusting the height of the waveguide 41 to the height of the waveguide 41a is formed on the surface of the Si substrate 40 in the arrangement area on which the semiconductor element 44 is arranged. An upper surface of the platform member 45 is substantially parallel with the upper surface of the Si substrate 40. A mark 46 is provided on the arrangement area of the Si substrate 40. The mark 46 is opaque to an alignment light being an electromagnetic wave with a predetermined wavelength range exemplified by the infrared ray in a present embodiment. An area surrounding the mark 46 transmits the alignment light (infrared ray). It is desirable to provide two marks 46 or more. In order to improve an positioning accuracy of the optical waveguides, it is most preferable to form a pair of the marks 46 arranged so as to sandwiching a position corresponding to the waveguide 41 formed in the semiconductor element 44 as shown in FIG. 9B.

FIG. 9C(a) shows a surface (connection surface, under side (or near side) surface in FIG. 9A) of the semiconductor element 44, opposing to the Si substrate 40. Electrodes are formed on an electrode formation area 47 of the connection surface. The area on which the electrodes formed is opaque to infrared ray. An electrode removed area 48 is formed by removing an electrode of a predetermined area in the connection surface. The electrode removed areas 48 functions as marks for alignment. An arrangement position of the electrode removed areas 48 corresponds to an arrangement position of the marks 46 on a side of the Si substrate 40. When the positions of the electrode removed area 48 and the mark 46 correspond to each other from the viewpoint normal to the surface of the Si substrate 40, the mark 46 is included in the electrode removed area 48 and is smaller than the electrode removed area 48. The electrode removed area 48 transmits infrared ray. It is preferable for the electrode removed area 48 to be a pair of areas arranged so as to sandwich the waveguide 41 when seen from the direction normal to the connection surface.

FIG. 9C(b) shows a reverse side (an upper surface in FIG. 9A) of the semiconductor element 44 being the side opposite to the connection surface of the semiconductor element 44. The reverse side is substantially parallel with the connection surface. A conductive electrode formation area 49 which is opaque to infrared ray and an electrode removed area 50 which transmits infrared ray are formed on the reverse side of element. When the electrode removed area 50 is seen from a normal direction of the reverse side, the electrode removed area 48 in the connection surface is included in the electrode removed area 50 in the reverse side.

The semiconductor element 44 having such an electrode pattern is placed by being roughly positioned on the electrode 45 in the arrangement area of the Si substrate 40. Infrared ray is emitted to a direction from the Si substrate to the semiconductor element 44. By taking an infrared image from the side of the reverse surface of the semiconductor element 44, a position of the semiconductor element 44 with respect to the Si substrate 40 can be recognized based on a relative position between the electrode removed area 48 in the connection surface which can be seen through the electrode removed area 50 and the mark 46 on the Si substrate 40. When the semiconductor element 44 is arranged on a correct position with respect to the Si substrate 40, the entire mark 46 can be seen in the electrode removed area 48. The passive alignment is realized by determining this state as a correctly adjusted state.

In this adjusted state, optical axes of the waveguide 41 in the semiconductor element 44 and the waveguide 41a formed in the Si substrate 40 are accurately adjusted. When it is judged that the semiconductor element 44 is arranged on a correct position in this manner, the semiconductor element 44 is fixed to the Si substrate 40 by means such as soldering. The waveguide 41 in the semiconductor element 44 fixed by this manner and the waveguide 41a in the Si substrate 40 are precisely coupled to form one optical waveguide.

Figure 10A:
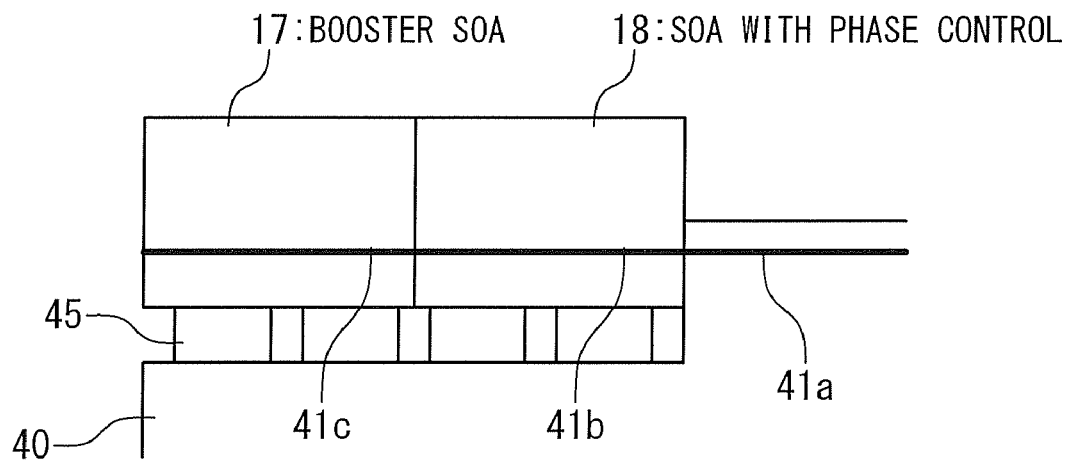
FIG. 10A is a view for explaining a method of a passive alignment.
Figure 10B:
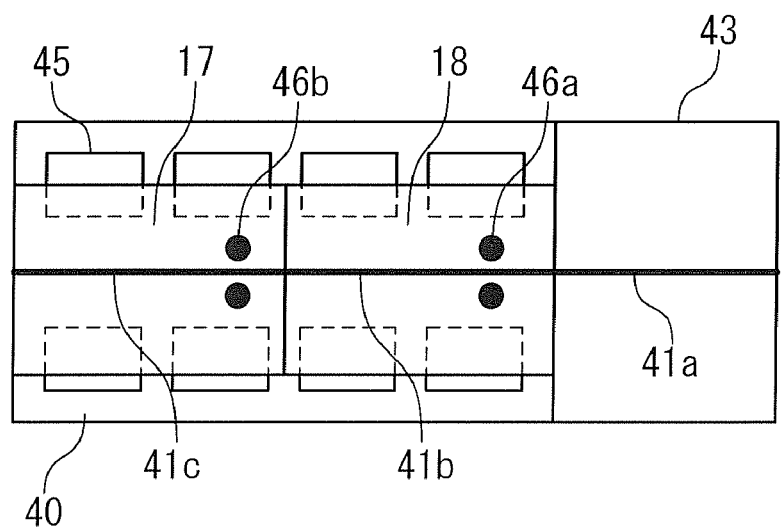
FIG. 10B is a view for explaining a method of a passive alignment.

FIGS. 10A and 10B are views for explaining a procedure to mount two semiconductor elements based on the passive alignment. In this drawings, similar to FIG. 7, the SOA with phase control 18 and the booster SOA 17 are used as examples of the semiconductor elements.

At first, the SOA with phase control 18 is positioned by the method explained with referring to FIGS. 9A to 9C, and fixed to the Si substrate 40 by soldering material having a first melting point. Then, the booster SOA 17 is also positioned by the method explained with referring to FIGS. 9A to 9C, and fixed to the Si substrate 40 by soldering material having a melting point lower than the first melting point. Through using different kinds of soldering material having the melting points different to each other, the SOA with phase control 18 is prevented from becoming out of alignment when fixing the booster SOA 17. When using Au and Sn for example, the soldering materials having different melting point can be obtained by changing the compounding ratio of Au and Sn, or can be obtained by using soldering material made of different raw material. Based on such mounting, a plurality of the waveguides in the semiconductor elements (the waveguide 41c in the booster SOA 17 and the waveguide 41b in the SOA with phase control 18) and the PLC waveguide 41a in the Si substrate 40 are coupled with high precision to form a continuous waveguide path, and manufacturing of the wavelength-tunable laser can be realized with high yield.

By applying pressure bonding after attaching a same metal (for example, Au) to an element side and a substrate side opposing to each other in stead of the soldering, the element can be attached to the Si substrate without misalignment. According to such mounting method, even when the number of the elements to be mounted to the Si substrate is three or more, the elements can be easily attached without misalignment.

Figure 11:
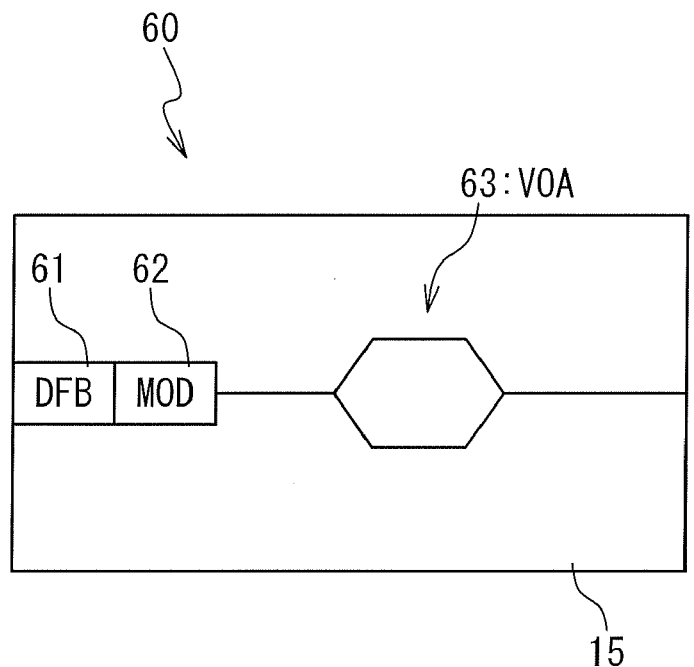
FIG. 11 shows an optical device according to an exemplary embodiment of the present invention.

FIG. 11 shows another exemplary embodiment of an optical device according to the present invention. In this optical device 60, a VOA (Variable Optical Attenuator) 63 is formed by a planar optical waveguide formed on the substrate 15. The VOA shown in FIG. 11 is realized by a symmetry Mach-Zehnder interferometer for controlling the output signal light by giving temperature difference to a symmetry pair of the optical waveguides included in the Mach-Zehnder interferometer. First, an optical modulator 62 is positioned and fixed to the substrate 15 based on the passive alignment. Then, a DFB laser 61 is positioned and fixed on a position adjacent to the optical modulator 62 based on the passive alignment. The DBF laser 61 is driven by a constant electric current and outputs a signal light. The optical modulator 62 modulates a signal light outputted by the DBF laser 61. The signal light outputted from the optical modulator 62 is suitable for optical communication of long distance and large capacity since the wavelength chirping in the modulation is low.

Figure 12:
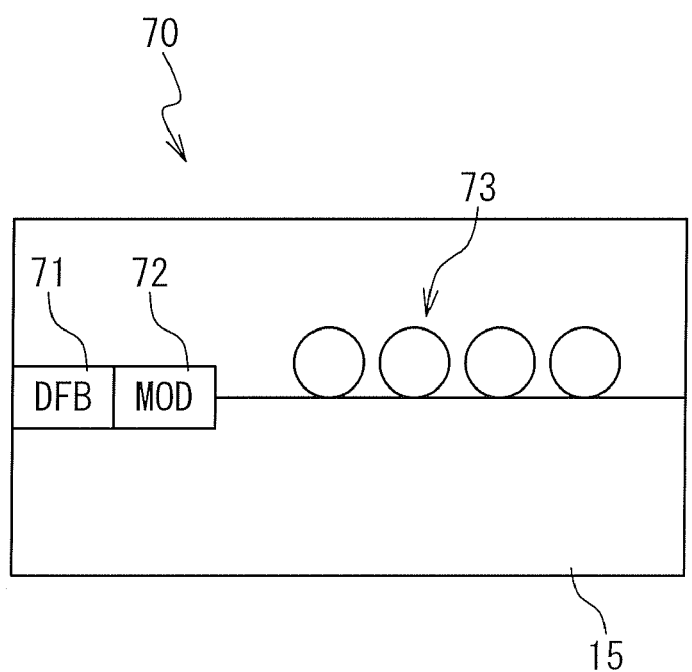
FIG. 12 shows an optical device according to an exemplary embodiment of the present invention.

FIG. 12 shows further another exemplary embodiment of an optical device according to the present invention. In this optical device 70, a variable dispersion compensator 73 having a ring resonator and a heater for controlling temperature of the ring resonator is formed by a planar waveguide formed on the substrate 15. First, an optical modulator 72 is positioned and fixed to the substrate 15 based on the passive alignment. Then, a DFB laser 71 is positioned and fixed on a position adjacent to the optical modulator 72 based on the passive alignment. The DFB laser 71 is driven by a constant electric current and outputs signal light. The optical modulator 72 modulates the signal light outputted by the DFB laser 71. A signal light suitable for an optical communication of long distance and large capacity can be generated since the wavelength dispersion occurring in an optical fiber is balanced out by precisely controlling a resonance wavelength through supplying electricity for heaters of the ring resonator.

Figure 13:
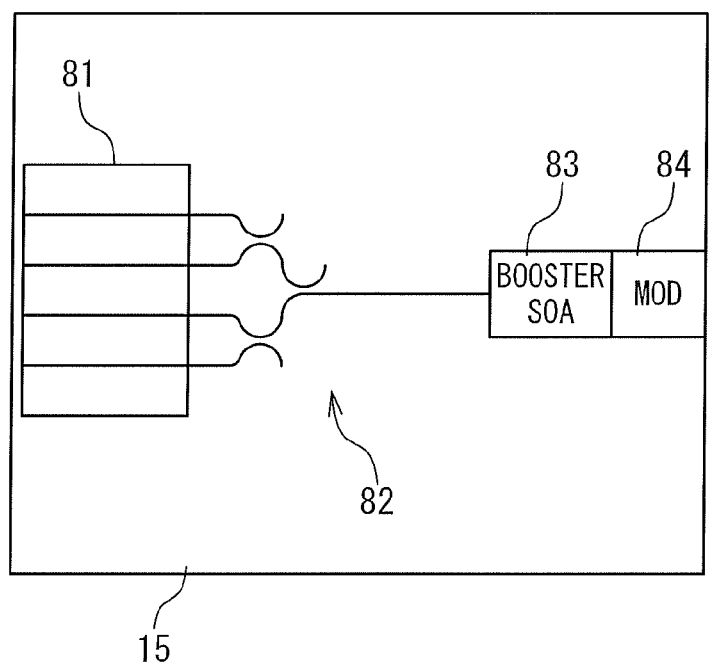
FIG. 13 shows an optical device according to an exemplary embodiment of the present invention.

FIG. 13 shows further another exemplary embodiment of an optical device according to the present invention. In this optical device 80, an optical switch (optical selector) 82 is formed by planar optical waveguide formed in the substrate 15. The optical switch 82 is realized by the symmetry Mach-Zehnder interferometer. In the example shown in FIG. 13, one of the optical signals of 4 channels is selected by the optical switch 82. At first, a booster SOA 83 is positioned and fixed on one end of this substrate 15 based on the passive alignment. Then, an optical modulator 84 is positioned and fixed on a position adjacent to the booster SOA 83 based on the passive alignment. Furthermore, an array DFB laser 81 is positioned and fixed on another end of the substrate 15 based on the passive alignment. The array DFB laser 81 includes a plurality of DFB lasers (4 lasers in the example of FIG. 13) having oscillation wavelengths different to each other. According to such optical device 80, the wavelength-tunable laser and the modulator are integrated in one chip, and a wavelength-tuning and modulation can be performed in a wide range.

Figure 14:
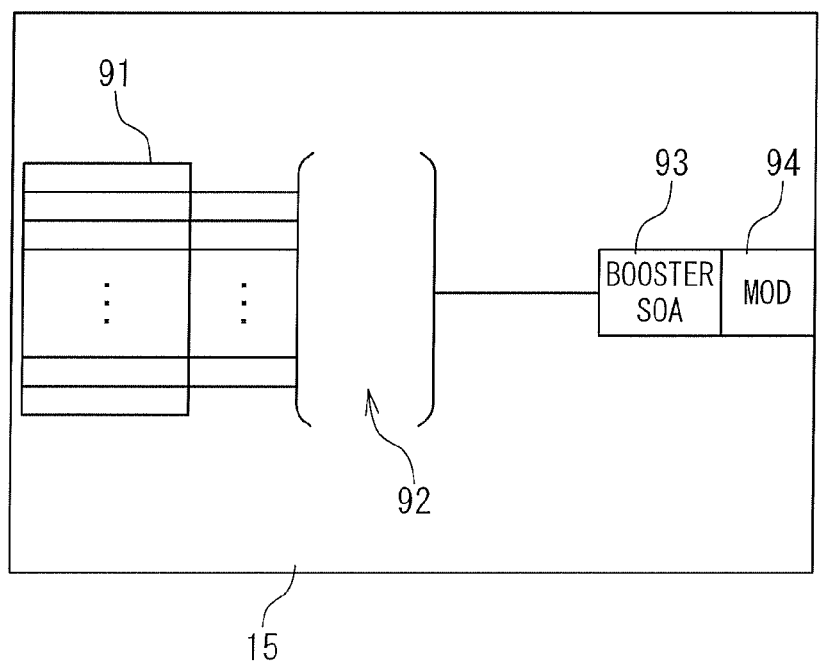
FIG. 14 shows an optical device according to an exemplary embodiment of the present invention.

FIG. 14 shows further another exemplary embodiment of an optical device according to the present invention. In the optical device 90, an optical coupler 92 is formed by optical waveguides formed on the substrate 15. The optical coupler 92 couples a plurality of optical waveguides with the one optical waveguide. A booster SOA 93 is positioned and fixed on one end of this substrate 15 based on the passive alignment. An optical modulator 94 is positioned and fixed on a position adjacent to the booster SOA 93. An array DFB laser 91 is positioned and fixed on another end of the substrate 15 based on the passive alignment. A plurality of outputs of the array DFB laser 91 is coupled to a plurality of channels of the optical coupler 92, respectively. Due to such optical device, the wavelength-tuning and modulation can be realized in one chip.

Although the present invention has been described above in connection with several exemplary embodiments thereof, it would be apparent to those skilled in the art that those exemplary embodiments are provided solely for illustrating the present invention, and should not be relied upon to construe the appended claims in a limiting sense.

What is claimed is:

1. An optical device comprising:
   a substrate side waveguide formed on a substrate;
   a highly reflective surface on a first side of the substrate side waveguide, the highly reflective surface at least substantially extending along an entirety of a length of the first side of the substrate side waveguide; and
   a plurality of optical elements fixed on the substrate and positioned towards a second side of the substrate side waveguide opposite to the first side of the substrate side waveguide,
   wherein the substrate side waveguide and an optical element side waveguide formed in each of the plurality of optical elements forms a continuous optical waveguide path,
   wherein the substrate side waveguide forms a resonator in which an input signal light resonates, the resonator being a multiple ring oscillator having a first ring resonator positioned towards an optical element side of the substrate, a second ring resonator positioned towards an end of the substrate opposite to the optical element side of the substrate, and a third ring resonator positioned between the first ring resonator and the second ring resonator, and wherein the substrate side waveguide comprises:
- a first waveguide portion between and optically coupling the first ring resonator and the third ring resonator, the first waveguide portion extending completely from the second side of the substrate side waveguide to and joining the highly reflective surface on the first side of the substrate side waveguide; and,
- a second waveguide portion between and optically coupling the second ring resonator and the third ring resonator, the second waveguide portion extending completely from the second side of the substrate side waveguide to and joining the highly reflective surface on the first side of the substrate side waveguide.

2. The optical device according to claim 1, wherein the optical device further comprises an oscillation wavelength tuning section configured to generate an output signal light by tuning the input signal light based on a tuning of an oscillation wavelength of the resonator.

3. The optical device according to claim 2, wherein the first ring resonator and the second ring resonator have waveguide lengths that are different to each other.

4. The optical device according to claim 2, wherein the plurality of optical elements includes a semiconductor optical amplifier configured to amplify a supplied optical signal to supply the resonator as the input signal.

5. The optical device according to claim 4, wherein the semiconductor optical amplifier is a booster semiconductor optical amplifier amplifying the supplied optical signal, and the plurality of optical elements further includes a phase controlling semiconductor optical amplifier configured to control a phase of an optical signal.

6. The optical device according to claim 1, wherein the plurality of optical elements includes an optical modulator.

7. The optical device according to claim 1, wherein an optical axis of each of the plurality of optical elements are aligned by using a substrate side alignment mark formed on a surface of the substrate and an optical element side alignment mark formed on each of the optical elements and positionally corresponds to the substrate side alignment mark, wherein the substrate side alignment mark transmits an alignment light of a predetermined wavelength and surrounded by an area opaque to the alignment light, and the optical element side alignment mark transmits the alignment light and surrounded by an area opaque to the alignment light.

8. The optical device according to claim 1, wherein the substrate side waveguide further comprises a third waveguide portion between the second ring resonator and the end of the substrate opposite to the optical element side of the substrate, the third wave guide portion optically coupled to the second ring resonator, the third wave guide portion extending in a substantially straight line from the highly reflective surface on the first side of the substrate to the second ring resonator and thereafter curving after being optically coupled to the second ring resonator.

* * * * *